US007935828B2

(12) United States Patent
Tomino et al.

(10) Patent No.: US 7,935,828 B2
(45) Date of Patent: May 3, 2011

(54) ORGANIC SEMICONDUCTOR MATERIAL, ORGANIC SEMICONDUCTOR STRUCTURE AND ORGANIC SEMICONDUCTOR APPARATUS

(75) Inventors: Ken Tomino, Tokyo-To (JP); Shigeru Sugawara, Tokyo-To (JP); Hiroki Maeda, Tokyo-To (JP); Masanao Matsuoka, Tokyo-To (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 984 days.

(21) Appl. No.: 11/445,940

(22) Filed: Jun. 2, 2006

(65) Prior Publication Data
US 2007/0128764 A1    Jun. 7, 2007

(30) Foreign Application Priority Data
Jun. 3, 2005    (JP) .................. 2005-163552

(51) Int. Cl.
  *H01L 21/00*    (2006.01)
  *H01L 51/30*    (2006.01)
  *C07D 513/04*   (2006.01)
(52) U.S. Cl. .................. 548/153; 257/40; 257/E51.001; 438/99
(58) Field of Classification Search .................. 548/153
  See application file for complete search history.

(56) References Cited

U.S. PATENT DOCUMENTS
2005/0127354 A1 *   6/2005   Hanna et al. .................. 257/40

FOREIGN PATENT DOCUMENTS
GB        1243060       *   8/1971
WO        WO-03/080732 A1 *   2/2003
WO        WO-2005/029605 A1 *   3/2005

OTHER PUBLICATIONS

Ando, Shinji et al., "Synthesis, physical properties, and field-effect transistors of novel thiophene/thiazolothiazole co-oligomers", J. Mater. Chem., 2004, 14, pp. 1787-1790.
Ando, Shinji et al., "Characterization and Field-Effect Transistor Performance of Heterocyclic Oligomers Containing a Thiazolothiazole Unit", The Chemical Society of Japan, Chemistry Letters, vol. 33, No. 9, (2004), pp. 1170-1171.

* cited by examiner

*Primary Examiner* — Laura L. Stockton
(74) *Attorney, Agent, or Firm* — Burr & Brown

(57) ABSTRACT

The present invention is directed to the provision of a novel liquid crystalline organic semiconductor material that is highly stable under an film forming environment and, at the same time, can easily form a film, for example, by coating. The liquid crystalline organic semiconductor material is represented by chemical formula 1 wherein R1 and R2 represent an identical alkyl group having 7 to 20 carbon atoms:

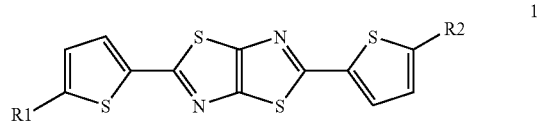

There is also provided a liquid crystalline organic semiconductor material characterized by being represented by chemical formula 2 wherein R3 and R4 represent an identical alkyl group having 7 to 20 carbon atoms:

8 Claims, 5 Drawing Sheets

CRYSTAL PHASE

SmX1 PHASE

SmA PHASE

NEMATIC PHASE

CRYSTAL PHASE
SmX PHASE
SmA PHASE
NEMATIC PHASE
F I G . 4

ORGANIC SEMICONDUCTOR MATERIAL, ORGANIC SEMICONDUCTOR STRUCTURE AND ORGANIC SEMICONDUCTOR APPARATUS

FIELD OF THE INVENTION

The present invention relates to an organic semiconductor material comprising a liquid crystalline thiazolothiazole derivative, which organic semiconductor material is highly stable under an film forming environment and, at the same time, can easily form a film, for example, by coating, an organic semiconductor structure and an organic semiconductor device.

BACKGROUND OF THE INVENTION

Attention has recently been drawn to studies on organic semiconductor structures using an organic semiconductor material, and application of organic semiconductor structures to various devices has been expected. Devices utilizable, for example, in large-area flexible display devices, for example, thin-film transistors (also known as "organic TFTs"), luminescent elements, and solar cells are being studied for such application.

In order to utilize organic semiconductor structures on a practical level, the organic semiconductor layer formed of an organic semiconductor material should exhibit stable charge mobility in a wide service temperature range, and, at the same time, even thin film should be easily formed in a wide area. In particular, properties satisfying the following requirements are desired: the formation of a film by coating rather than film formation by conventional techniques such as vapor deposition is possible; properties in a film formation environment are stable; and stable high charge mobility can be exhibited in a wide service temperature range including room temperature (about −40 to +90° C.).

Regarding prior art documents relevant to the present invention, for example, non-patent documents 1 and 2 describe thiazolothiazole derivatives represented by the following chemical formulae 3 to 5. These documents describe that the thiazolothiazole derivatives represented by the following chemical formulae 4 and 5 can realize transistor operation. In these cases, however, film formation is carried out by vapor deposition, and, further, there is no description on liquid crystallinity and solubility in solvents of the thiazolothiazole derivatives.

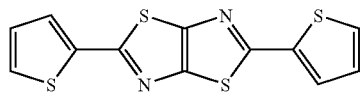

3

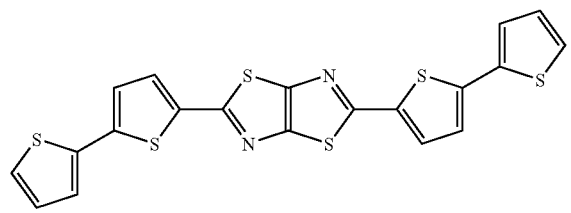

4

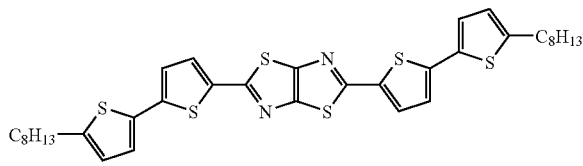

5

Non-patent document 1: S. Ando, J. Nishida, et al., J. Mater. Chem., vol. 14, p. 1787-1790 (2004)
Non-patent document 2: S. Ando, J. Nishida, et al., Chemistry Letters, vol. 33, No 9, p. 1170-1171 (2004)

SUMMARY OF THE INVENTION

Problems to be Solved by the Invention

Properties desired to be possessed by organic semiconductor materials for forming organic TFTs utilizable on a practical level, for example, in large-area flexible display devices include that the materials are soluble in solvents and can easily be brought to coating liquids, the properties of the materials are stable under a film formation environment, and films having stable charge mobility in a wide service temperature range including room temperature can be formed. The development of such organic semiconductor materials has been expected.

The present invention has been made with a view to meeting the above demand, and an object of the present invention is to provide a novel liquid crystalline organic semiconductor material that is highly stable under a film formation environment and, at the same time, can easily be brought to a film, for example, by coating. Another object of the present invention is to provide an organic semiconductor structure and an organic semiconductor device comprising an organic semiconductor layer formed of this organic semiconductor material.

Means for Solving the Problems

The above object of the present invention can be attained by an organic semiconductor material characterized by being represented by chemical formula 1 wherein R1 and R2 represent an identical alkyl group having 7 to 20 carbon atoms:

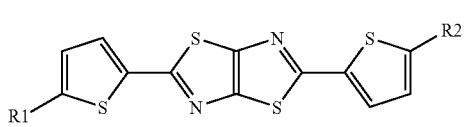

1

Further, the above object of the present invention can be attained by an organic semiconductor material characterized by being represented by chemical formula 2 wherein R3 and R4 represent an identical alkyl group having 7 to 20 carbon atoms:

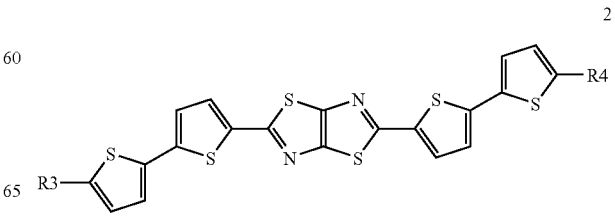

2

In the organic semiconductor materials according to the present invention represented by chemical formulae 1 and 2, thiazolothiazole derivatives containing an identical alkyl group having 7 to 20 carbon atoms at both ends thereof are liquid crystalline and, at the same time, are soluble in solvents. Coating liquids prepared by dissolving such organic semiconductor materials in solvents can easily realize the formation of an organic semiconductor layer utilizable, for example, in large-area flexible display devices. Further, the organic semiconductor materials according to the present invention have such a chemical structure that an electron-withdrawing thiazolothiazole skeleton has been introduced into an electron-donating thiophene skeleton containing an alkyl group at its both ends. By virtue of this chemical structure, advantageously, π electrons can be delocalized, lifting of HOMO (highest occupied molecular orbital) can be suppressed, and LUMO (lowest unoccupied molecular orbital) can be lowered. As a result, the above chemical structure can advantageously narrow the band gap of the organic semiconductor material according to the present invention and further can suppress an increase in ionization potential. In particular, the suppression of the increase in ionization potential can suppress oxidation under a film formation environment. Therefore, an organic semiconductor layer, which is less likely to undergo oxidation and the like and is stable, can be formed by forming the organic semiconductor layer using this organic semiconductor material.

Further, the above object of the present invention can be attained by an organic semiconductor structure characterized by comprising an organic semiconductor layer formed of the above organic semiconductor material according to the present invention, the organic semiconductor layer having a smectic liquid crystal phase or a crystal phase at least in a room temperature region.

According to the present invention, since the organic semiconductor material according to the present invention is a liquid crystalline material having excellent solubility in solvents, the formation of an organic semiconductor layer by using a coating liquid comprising this organic semiconductor material can easily realize the formation of an organic semiconductor structure utilizable, for example, in large-area flexible display devices. Further, since the organic semiconductor layer formed of the organic semiconductor material according to the present invention has a smectic liquid crystal phase or a crystal phase at least in a room temperature region, for example, when a coating liquid containing the organic semiconductor material is heated to bring the phase to an isotropic phase or a liquid crystal phase and, in this heated state, is coated followed by cooling to room temperature, a smectic liquid crystal phase or a crystal phase, in which a core part comprising a thiazolothiazole skeleton and a thiophne skeleton and an alkyl chain part are arranged in alignment relationship is formed and, consequently, stable charge mobility can be realized at least in a room temperature region.

The above object of the present invention can be attained by an organic semiconductor device characterized by comprising at least a substrate, a gate electrode, a gate insulating layer, an organic semiconductor layer, a drain electrode, and a source electrode, said organic semiconductor layer being formed of the above organic semiconductor material according to the present invention. According to this invention, since the organic semiconductor layer is formed using a liquid crystalline organic semiconductor material which is highly stable under a film formation environment and, at the same time, can be easily brought to a film, for example, by coating, an organic semiconductor device utilizable, for example, in large-area flexible display devices can easily be formed.

Further, according to the present invention, there is also provided use of the above organic semiconductor structure, as an organic transistor, an organic EL element, an organic electronic device, or an organic solar cell.

EFFECT OF THE INVENTION

Since the organic semiconductor material according to the present invention is liquid crystalline and, at the same time, is soluble in solvents, coating liquids prepared by dissolving such organic semiconductor materials in solvents can easily realize the formation of an organic semiconductor layer utilizable, for example, in large-area flexible display devices. Further, the organic semiconductor materials according to the present invention have such a chemical structure that an electron-withdrawing thiazolothiazole skeleton has been introduced into between electron-donating thiophene skeletons. By virtue of this chemical structure, advantageously, π electrons can be delocalized, lifting of HOMO can be suppressed, and LUMO can be lowered. As a result, advantageously, the band gap of the organic semiconductor material can be narrowed, and, at the same time, an increase in ionization potential can be suppressed. In particular, a stable organic semiconductor layer, which is less likely to undergo oxidation and the like, can be formed.

According to the organic semiconductor structure according to the present invention, an organic semiconductor structure utilizable, for example, in large-area flexible display devices can be easily formed. Further, when a coating liquid containing the organic semiconductor material is heated to bring the phase to an isotropic phase or a liquid crystal phase and, in this heated state, is coated followed by cooling to room temperature, a smectic liquid crystal phase or a crystal phase, in which a core part comprising a thiazolothiazole skeleton and a thiophene skeleton and an alkyl chain part are arranged in alignment relationship is formed and, consequently, stable charge mobility can be realized.

Further, the organic semiconductor device according to the present invention are usable, for example, devices which are utilizable, for example, in large-area flexible display devices, for example, thin-film transistors, luminescent elements, and solar cells.

BRIEF DESCRIPTION OF THE DRAWINGS

FIG. 4 is a diagram showing the results of observation of texture by a polarizing microscope and a heating stage using a glass cell into which 10TT-ZZ-TT10 has been poured.

DESCRIPTION OF REFERENCE CHARACTERS

Figure 1:
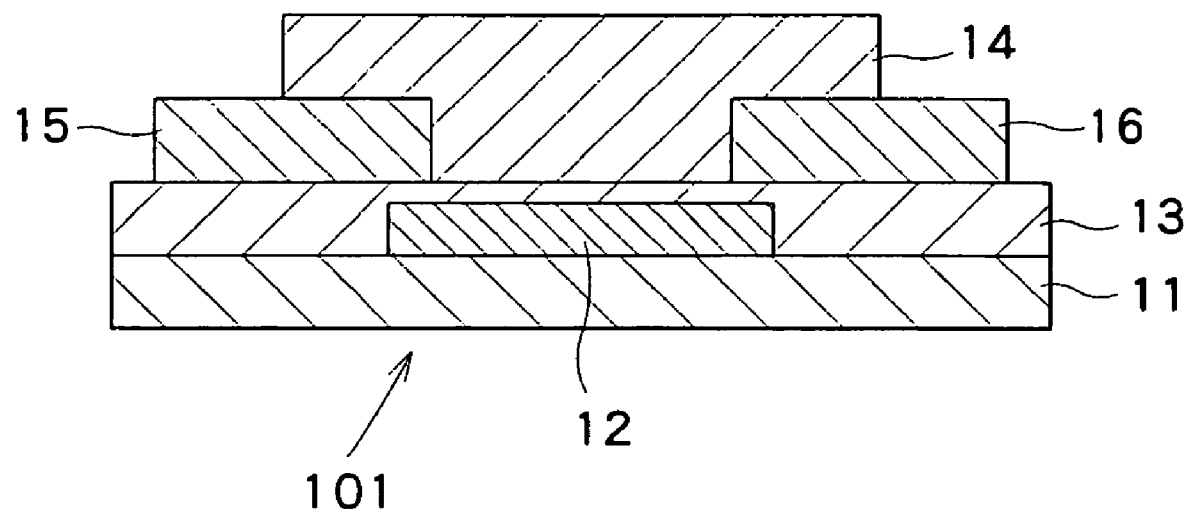
FIG. 1 is a cross-sectional view showing one embodiment of the organic semiconductor device according to the present invention.

101: organic semiconductor device,
11: substrate,
12: gate electrode,
13: gate insulating layer,
14: polymeric organic semiconductor layer,
15: drain electrode, and
16: source electrode.

DETAILED DESCRIPTION OF THE INVENTION

Organic semiconductor material, organic semiconductor structure, and organic semiconductor device according to the present invention will be described.

(Organic Semiconductor Material)

The first organic semiconductor material according to the present invention is characterized by being represented by the above chemical formula 1 wherein R1 and R2 represent an identical alkyl group having 7 to 20 carbon atoms (number of carbon atoms being hereinafter represented by "C"), that is, a C7 to C20 identical alkyl group. The second organic semiconductor material according to the present invention is characterized by being represented by the above chemical formula 2 wherein R3 and R4 represent a C7 to C20 identical alkyl group. In other words, the organic semiconductor materials according to the present invention can be said to have such a chemical structure that an electron-withdrawing thiazolothiazole skeleton has been introduced into an electron-donating thiophene skeleton having a C7 to C20 identical alkyl group at its both ends. Further, these organic semiconductor materials have a bilaterally symmetric chemical structure. In the present specification, the organic semiconductor materials according to the present invention are sometimes referred to as "thiazolothiazole derivatives."

In chemical formula 1, R1 and R2 represent a C7 to C20 identical alkyl group and may be of straight chain or branched chain type. R1 and R2, however, preferably represent a straight chain alkyl group. When the number of carbon atoms in the alkyl group is 6 or less, the material is not liquid crystalline. On the other hand, when the number of carbon atoms is 21 or more, the proportion of the alkyl chain part as an insulator to the whole skeleton is too large to develop good charge mobility properties.

Likewise, in chemical formula 2, R3 and R4 represent a C7 to C20 identical alkyl group and may be of straight chain or branched chain type. R3 and R4, however, preferably represent a straight chain alkyl group. When the number of carbon atoms in the alkyl group is 6 or less, the material is not liquid crystalline. On the other hand, when the number of carbon atoms is 21 or more, the phase transition temperature to the liquid crystal phase is so high that coating after heating becomes difficult.

In the organic semiconductor materials represented by chemical formulae 1 and 2, due to the production process, the alkyl group is bilaterally symmetric. Therefore, an identical alkyl group is present at both ends of the core part of the thiazolothiazole skeleton and the thiophene skeleton.

The organic semiconductor materials according to the present invention have a C7 to C20 identical alkyl group at both ends and are liquid crystalline and, at the same time, are soluble in solvents. An organic semiconductor layer utilizable, for example, in large-area flexible display devices can easily be formed by dissolving the organic semiconductor material in a solvent such as toluene, xylene, tetralin, mesitylene, monochlorobenzene, or o-dichlorobenzene to prepare a coating liquid and then coating the coating liquid onto a predetermined base material such as a plastic substrate or a glass substrate optionally with various films formed thereon. In particular, when a coating liquid containing the organic semiconductor material according to the present invention is heated to bring the phase to an isotropic phase or a liquid crystal phase and, in this heated state, is coated followed by cooling, in the thiazolothiazole derivative according to the present invention, a core part comprising a thiazolothiazole skeleton and a thiophene skeleton are arranged in alignment relationship and, consequently, stable charge mobility can be realized, for example, by hopping conduction in the core part.

Further, as is apparent from the above chemical formulae 1 and 2, the organic semiconductor materials according to the present invention have such a chemical structure that an electron-withdrawing thiazolothiazole skeleton has been introduced into an electron-donating thiophene skeleton containing an alkyl group at its both ends. By virtue of this chemical structure, advantageously, π electrons can be delocalized, lifting of HOMO can be suppressed, and LUMO can be lowered. Therefore, the introduction of a thiazolothiazole skeleton into the thiophene skeleton is advantageous for narrowing the band gap of the compound and further can suppress an increase in ionization potential. In particular, the suppression of the increase in ionization potential can suppress oxidation under an organic semiconductor layer formation environment (for example, in the atmosphere). Therefore, an organic semiconductor layer, which is less likely to undergo oxidation and the like and is stable, can be formed by forming the organic semiconductor layer using this organic semiconductor material.

Further, since the organic semiconductor materials according to the present invention have a bilaterally symmetric chemical structure, π electrons are delocalized by the action of the electron-withdrawing thiazolothiazole skeleton introduced in its center. Consequently, advantageously, the band gap of the compound can be narrowed, and, further, an increase in ionization potential can be suppressed.

Although the thiazolothiazole derivatives described in the above-described non-patent documents 1 and 2 are not liquid crystalline, the thiazolothiazole derivatives are utterly different from the organic semiconductor materials according to the present invention in that the thiazolothiazole derivatives described in the above-described non-patent documents 1 and 2 are organic semiconductor materials, from which a film is formed by vacuum vapor deposition, and are not required to be liquid crystalline.

(Organic Semiconductor Structure)

The organic semiconductor structure according to the present invention comprises an organic semiconductor layer formed of the above organic semiconductor material. The organic semiconductor layer has a smectic liquid crystal phase or a crystal phase at least in the room temperature region. In the present invention, the room temperature region refers to a temperature range of −40° C. to 90° C. which is a common service temperature range of semiconductor elements such as organic TFTs.

According to DSC (differential scanning calorimeter, DSC204u-Sensor manufactured by NETZSCH) measurement, for example, the phase transition temperature of 2,5-bis(5-octylethynyl-1,3-thiazolo[5,4-d]-1,3-thiazole (referred to also as "8T-ZZ-T8"), which is represented by chemical formula 1 wherein R1 and R2 represent a straight chain octyl group having 8 carbon atoms, is crystal phase/69.6° C./smectic X1 phase (SmX1 phase)/110.2° C./smectic A phase (SmA phase)/118.0° C./nematic phase/119.0° C./isotropic phase, and the phase transition temperature of 2,5-bis(5'-decyl-5-[2,2']bithienyl)-1,3-thiazolo[5,4-d]-1,3-thiazole (referred to also as "OTT-ZZ-TT10"), which is represented by chemical formula 2 wherein R3 and R4 represent a straight chain octyl group having 10 carbon atoms, is 42.1° C./crystal phase 2/141.7° C./crystal phase 1/155.7° C./smectic X phase (SmX phase)/176.3° C./smectic A phase (SmA phase)/249.6° C./nematic phase/254.6° C./isotropic phase. The temperature indicated between the phases refers to the phase transition temperature between the phase indicated on the left side and the phase indicated on the right side. For example, "crystal phase/69.6° C./SmX1 phase" means that the phase transition temperature between the crystal phase and the mixed SmX1 phase is 69.6° C.

When a coating liquid containing the above-described organic semiconductor material is heated to at a temperature at least above the crystallization temperature to bring the phase to an isotropic phase or a liquid crystal phase and, in this heated state, is coated onto a substrate followed by cooling to room temperature, a smectic liquid crystal phase or a crystal phase, in which a core part comprising a thiazolothiazole skeleton and a thiophene skeleton and an alkyl chain part in each of the thiazolothiazole derivatives, are arranged in alignment relationship is formed and, consequently, stable charge mobility can be realized at least in the room temperature region. Various coating methods and printing methods can be applied in the coating in this case.

Alignment in coating the organic semiconductor material onto a substrate can be carried out by coating the organic semiconductor material onto a liquid crystal aligning layer formed of a polyimide material, or by coating the organic semiconductor material onto a liquid crystal aligning layer formed of a cured resin having very small concaves and convexes on its surface.

A first embodiment of the organic semiconductor structure according to the present invention comprises a substrate, a liquid crystal aligning layer, and an organic semiconductor layer stacked in that order. A second embodiment of the organic semiconductor structure according to the present invention comprises a substrate, an organic semiconductor layer, and a liquid crystal aligning layer stacked in that order. A third embodiment of the organic semiconductor structure according to the present invention comprises a substrate, a liquid crystal aligning layer, an organic semiconductor layer, and a liquid crystal aligning layer stacked in that order. In the present invention, a high level of alignment can be imparted to the organic semiconductor layer by forming the organic semiconductor layer in contact with the liquid crystal aligning layer.

As described above, in the organic semiconductor structure according to the present invention, when a coating liquid containing the organic semiconductor material is heated to bring the phase to an isotropic phase or a liquid crystal phase and, in this heated state, is coated onto a substrate followed by cooling to room temperature, a smectic liquid crystal phase or a crystal phase, in which a core part comprising a thiazolothiazole skeleton and a thiophene skeleton and an alkyl chain part are arranged in alignment relationship is formed and, consequently, stable charge mobility can be realized at least in the room temperature region. Accordingly, application to an semiconductor layer, for example, to thin-film transistors and field-effect transistors utilizable, for example, in large-area flexible display devices can be expected.

(Organic Semiconductor Device)

An organic semiconductor device 101 according to the present invention, for example, as shown in FIG. 1, comprises at least a substrate 11, a gate electrode 12, a gate insulating layer 13, an organic semiconductor layer 14, a drain electrode 15, and a source electrode 16. In this organic semiconductor device 101, the organic semiconductor layer 14 is formed of the organic semiconductor material constituting the organic semiconductor structure according to the present invention.

Examples of the construction include a reversed stagger structure (not shown) comprising a substrate 11 and a gate electrode 12, a gate insulating layer 13, an aligned organic semiconductor layer 14, a drain electrode 15 and a source electrode 16, and a protective film 17 provided in that order on the substrate 11, or a coplanar structure (see FIG. 1) comprising a substrate 11 and a gate electrode 12, a gate insulating layer 13, a drain electrode 15 and a source electrode 16, an organic semiconductor layer 14, and a protective film (not shown) provided in that order on the substrate 11. The organic semiconductor device 101 having the above construction is operated in either an storage state or a deficiency state depending upon the polarity of the voltage applied to the gate electrode 12. Members for constituting the organic semiconductor device will be described in detail.

(Substrate)

The substrate 11 may be selected form a wide range of insulating materials. Examples of such materials include inorganic materials such as glasses and alumina sinters, polyimide films, polyester films, polyethylene films, polyphenylene sulfide films, poly-p-xylene films and other various insulating materials. The use of a film or sheet substrate formed of a polymer compound is very useful because a lightweight and flexible organic semiconductor device can be prepared. The thickness of the substrate 11 applied in the present invention is about 25 μm to 1.5 mm.

(Gate Electrode)

The gate electrode 12 is preferably an electrode formed of an organic material such as polyaniline or polythiophene, or an electrode formed by coating an electrically conductive ink. These electrodes can be formed by coating an organic material or an electrically conductive ink and thus is advantageous in that the electrode formation process is very simple. Specific methods usable for the coating include spin coating, casting, pulling-up, and transfer and ink jet methods.

When a metal film is formed as the electrode, a conventional vacuum film formation method may be used for the metal film formation. Specifically, a mask film formation method or a photolithographic method may be used. In this case, materials usable for electrode formation include metals such as gold, platinum, chromium, palladium, aluminum, indium, molybdenum, and nickel, alloys using these metals, and inorganic materials such as polysilicon, amorphous silicone, tin oxide, indium oxide, and indium tin oxide (ITO). These materials may be used in a combination of two or more.

The film thickness of the gate electrode is preferably about 50 to 1000 nm although the film thickness varies depending upon the electric conductivity of the material for electrode. The lower limit of the thickness of the gate electrode varies depending upon the electric conductivity of the electrode material and the adhesive strength between the gate electrode and the underlying substrate. The upper limit of the thickness of the gate electrode should be such that, when a gate insulating layer and a source-drain electrode pair, which will be described later, are provided, the level difference part between the underlying substrate and the gate electrode is satisfactorily covered for insulation by the gate insulating layer and, at the same time, an electrode pattern formed thereon is not broken. In particular, when a flexible substrate is used, the balance of stress should be taken into consideration.

(Gate Insulating Layer)

As with the gate electrode 12, the gate insulating layer 13 is preferably formed by coating an organic material. Organic materials usable herein include polychloropyrene, polyethylene terephthalate, polyoxymethylene, polyvinyl chloride, polyvinylidene fluoride, cyanoethylpullulan, polymethyl methacrylate, polysulfone, polycarbonate, and polyimide. Specific examples of methods usable for coating include spin coating, casting, pulling-up, and transfer and ink jet methods. A conventional pattern process such as CVD may also be used. In this case, inorganic materials such as $SiO_2$, SiNx, and $Al_2O_3$ are preferred. These materials may be used in a combination of two or more.

Since the charge mobility of the organic semiconductor device depends upon the field strength, the thickness of the gate insulating layer is preferably about 50 to 300 nm. In this case, the withstand voltage is preferably not less than 2 MV/cm.

(Drain Electrode and Source Electrode)

The drain electrode 15 and the source electrode 16 are preferably formed of a metal having a large work function. The reason for this is that, in the liquid crystalline organic semiconductor material according to the present invention, since carriers for transferring charges are holes, these electrodes should be in ohmic contact with the organic semiconductor layer 14. The work function referred to herein is an electric potential difference necessary for withdrawing electrons in the solid to the outside of the solid and is defined as a difference in energy between a vacuum level and a Fermi level. The work function is preferably about 4.6 to 5.2 eV. Such materials include gold, platinum, and transparent electrically conductive films (for example, indium tin oxide and indium zinc oxide). The transparent electrically conductive film may be formed by sputtering or electron beam (EB) vapor deposition. The thickness of the drain electrode 15 and the source electrode 16 applied in the present invention is about 50 nm.

(Organic Semiconductor Layer)

The organic semiconductor layer 14 is a layer formed of the organic semiconductor material according to the present invention. In the organic semiconductor layer 14, a smectic liquid crystal phase or a crystal phase, in which a core part comprising a thiazolothiazole skeleton and a thiophene skeleton, and an alkyl chain part are arranged in alignment relationship, is exhibited at least in a temperature range including room temperature. Thus, a characteristic effect that an even and large-area organic semiconductor layer can be formed, can be attained.

When the organic semiconductor layer forming face is a gate insulating layer or a substrate, an aligning film can be integrated with the gate insulating layer or the substrate by subjecting the gate insulating layer or the substrate to rubbing treatment.

(Interlayer Insulating Layer)

An interlayer insulating layer is preferably provided in the organic semiconductor device 101. In forming the drain electrode 15 and the source electrode 16 on the gate insulating layer 13, the interlayer insulating layer is formed to prevent the contamination of the surface of the gate electrode 12. Accordingly, the interlayer insulating layer is formed on the gate insulating layer 13 before the formation of the drain electrode 15 and the source electrode 16. After the formation of the drain electrode 15 and the source electrode 16, the interlayer insulating layer in its part located above the channel region is completely or partly removed. The interlayer insulating layer region to be removed is preferably equal to the size of the gate electrode 12.

Materials usable for the interlayer insulating layer include inorganic material such as $SiO_2$, SiNx, and $Al_2O_3$ and organic materials such as polychloropyrene, polyethylene terephthalate, polyoxymethylene, polyvinyl chloride, polyvinylidene fluoride, cyanoethylpullulan, polymethyl methacrylate, polysulfone, polycarbonate, and polyimide.

(Other Embodiments of Organic Semiconductor Device)

Examples of the construction of the organic semiconductor device according to the present invention include (i) substrate/gate electrode/gate insulating layer (which functions also as liquid crystal aligning layer)/source-drain electrode/organic semiconductor layer (/protective layer), (ii) substrate/gate electrode/gate insulating layer/source-drain electrode/liquid crystal aligning layer/organic semiconductor layer (/protective layer), (iii) substrate/gate electrode/gate insulating layer (which functions also as liquid crystal aligning layer)/organic semiconductor layer/source-drain electrode/(protective layer), (iv) substrate/gate electrode/gate insulating layer (which functions also as liquid crystal aligning layer)/organic semiconductor layer/substrate with source-drain electrode patterned therein (which functions also as protective layer), (v) substrate/source-drain electrode/organic semiconductor layer/gate insulating layer (which functions also as liquid crystal aligning layer)/gate electrode/substrate (which functions also as protective layer), (vi) substrate (which functions also as aligning layer)/source-drain electrode/organic semiconductor layer/gate insulating layer/gate electrode/substrate (which functions also as protective layer), or (vii) substrate/gate electrode/gate insulating layer/source-drain electrode/organic semiconductor layer/substrate (which functions also as aligning layer).

In the organic semiconductor device, the organic semiconductor layer can easily be formed by coating using the organic semiconductor material according to the present invention.

EXAMPLES

The following Examples further illustrate the present invention.

Example 1

In Example 1, an organic semiconductor material represented by chemical formula 1 wherein R1 and R2 represent a C8 identical straight chain alkyl group, was prepared.

Synthesis of 2-octylthiophene

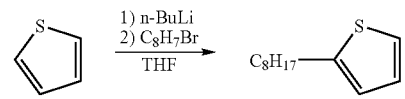

Thiophene (59.9 g, 0.713 mol) and dehydrated tetrahydrofuran (hereinafter referred to as "THF") (200 ml) were placed in a 1000-ml three-necked flask equipped with a 200-ml dropping funnel and a reflux tube. The solution was cooled to −78° C., and a solution (200 ml) of n-butyllithium (2.6 M) in n-hexane was added dropwise to the cooled solution over a period of about one hr. After the completion of the dropwise addition, the mixture was stirred at −78° C. for about one hr. Thereafter, the reaction temperature was raised to room temperature. At that temperature, the mixture was again stirred for one hr, and 1-bromooctane (91.8 g, 0.475 mol) was added dropwise thereto at 0° C. over a period of about one hr. After the completion of the dropwise addition, the reaction temperature was raised to room temperature, and, at that temperature, the mixture was stirred overnight. After the completion of the reaction, water (200 ml) was added, and the organic layer was extracted with diethyl ether, was dried over sodium sulfate, and was applied to column chromatography (n-hexane) to give an objective compound 2-octylthiophene as a yellow liquid (99.9 g, yield 97.8%). An NMR spectrum of the compound thus obtained was measured at room temperature with an NMR spectrometer (model JNM-LA400W, manufactured by Japan Electric Optical Laboratory). $^1$H-NMR (CDCl$_3$, TMS/ppm): 0.88 (t, 3H, J=6.83 Hz), 1.28 (m, 10H), 1.67 (m, 2H), 2.81 (t, 2H, J=7.32 Hz), 6.77 (dd, 1H, J=0.976 Hz, J=3.90 Hz), 6.91 (dd, 1H, J=3.90 Hz, J=4.88 Hz), 7.10 (dd, 1H, J=0.976 Hz, J=4.88 Hz).

Synthesis of 2-fomyl-5-octylthiophene

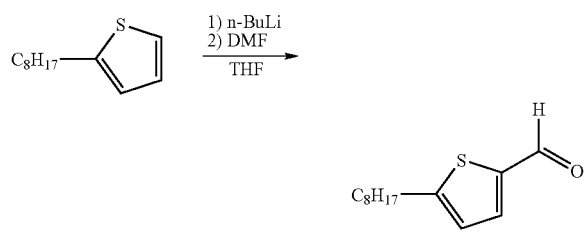

2-Octylthiophene (40.8 g, 0.208 mol) prepared above and THF (400 ml) were placed in a 1000-ml three-necked flask equipped with a 200-ml dropping funnel and a reflux tube, the solution was cooled to 0° C. in an ice bath, and a solution (100 ml) of n-butyllithium (2.6 M) in n-hexane was added dropwise to the cooled solution over a period of about one hr. After the completion of the dropwise addition, the mixture was stirred for about one hr, and dehydrated N,N-dimethylformamide (hereinafter referred to as "DMF") (91.8 g, 0.475 mol) was added dropwise thereto at 0° C. over a period of about one hr. After the completion of the dropwise addition, the reaction temperature was raised to room temperature, and, at that temperature, the mixture was stirred overnight. After the completion of the reaction, a 1 N ammonium chloride solution (200 ml) was added, and the organic layer was extracted with diethyl ether, was dried over sodium sulfate, and was applied to column chromatography (CH$_2$Cl:hexane=1:1) to give an objective compound 2-fomyl-5-octylthiophene as a yellow liquid (45.0 g, yield 96.4%). An NMR spectrum of the compound thus obtained was measured at room temperature with an NMR spectrometer (model JNM-LA400W, manufactured by Japan Electric Optical Laboratory). $^1$H-NMR (CDCl$_3$, TMS/ppm): 0.88 (t, 3H, J=6.83 Hz), 1.29 (m, 10H), 1.69 (m, 2H), 2.87 (t, 2H, J=7.32 Hz), 6.90 (d, 1H, J=3.90 Hz), 7.61 (d, 1H, J=3.90 Hz), 9.82 (s, 1H).

Synthesis of 2,5-bis(5-octyl-2-thienyl)-1,3-thiazolo[5,4-d]-1,3-thiazole (8T-ZZ-T8)

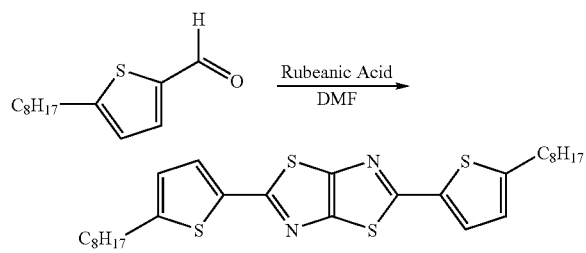

2-Fomyl-5-octylthiophene (14.9 g, 66.6 mmol) prepared above, rubeanic acid (2.0 g, 16.6 mmol), and DMF (100 ml) were placed in a 300-ml eggplant-type flask equipped with a reflux tube, and the solution was heated under reflux in an oil bath in an argon gas stream for about 6 hr. After the completion of the reaction, the mixture was allowed to cool to room temperature. Water (200 ml) was added thereto, and the precipitated brown crystal was collected by filtration and was dried in vacuo. After drying, the brown powder thus obtained was applied to column chromatography (CH$_2$Cl:hexane=1:10) to give an objective compound 2,5-bis(5-octylethynyl)-1,3-thiazolo[5,4-d]-1,3-thiazole (8T-ZZ-T8) as yellow powder (3.8 g, yield 42.80%). An NMR spectrum of the compound thus obtained was measured at room temperature with an NMR spectrometer (model JNM-LA400W, manufactured by Japan Electric Optical Laboratory). $^1$H-NMR (CDCl$_3$, TMS/ppm): 0.88 (t, 6H, J=6.83 Hz), 1.33 (m, 20H), 1.71 (m, 4H), 2.84 (t, 4H, J=7.32 Hz), 6.78 (d, 2H, J=3.90 Hz), 7.38 (d, 2H, J=3.90 Hz).

Preparation of FET Element

A wafer purchased from ELECTRONICS AND MATERIALS CORPORATION LIMITED was used in a test device. This wafer is an n-doped silicon wafer with a silicon oxide layer having a thickness of about 3000 angstroms (300 nm) thermally produced thereon. The wafer functioned as a gate electrode while the silicon oxide layer functioned as a gate dielectric material, and the electrostatic capacitance was about 11 nF/cm$^2$ (nanofarad/square centimeter). This wafer was immersed in a 0.1 M dehydrated toluene solution of phenyltrichlorosilane at 60° C. for 20 min. Next, this wafer was washed with toluene, and the remaining liquid was removed by a nitrogen air gun, followed by drying at 100° C. for one hr.

Next, gold source and drain electrodes were vacuum deposited onto the silicon oxide dielectric layer through a shadow mask with varied channel length and width. Thus, a series of transistor electrodes having various sizes were prepared. Thereafter, this wafer was heated to 60° C., and an organic semiconductor layer was formed by spin coating at a solution temperature of 60° C. at a speed of 2000 rpm for about 10 sec. The solution for the formation of the organic semiconductor layer was prepared by dissolving 0.50% by weight of 2,5-bis(5-octyl-2-thienyl)-1,3-thiazolo[5,4-d]-1,3-thiazole (8T-ZZ-T8) prepared above in toluene. These procedures were carried out under ambient conditions, and any measure for preventing the exposure of the material and apparatus to ambient oxygen, moisture, or light was not taken.

FET properties were evaluated by 237 HIGH VOLTAGE SOURCE MEASURE UNIT, manufactured by KEITHLEY. The carrier mobility ($\mu$) was calculated based on data in a saturation region (gate voltage $V_G$<source-drain voltage VSD) by the following equation (1). In equation (1), $I_{SD}$ represents drain current in the saturation region, W and L represent the width and length in the semiconductor channel, respectively, $C_i$ represents the electrostatic capacitance per unit area of the gate dielectric layer, and $V_G$ and $V_T$ represent gate voltage and threshold voltage, respectively. $V_T$ in this apparatus was determined from the relationship between the square root of $I_{SD}$ in the saturation region and $V_G$ in the apparatus determined from the measured date by extrapolating $I_{SD}$=0. The current on/off ratio is the ratio between saturation source/drain current at a gate voltage $V_G$ equal to or higher than the drain voltage $V_D$, and source/drain current at a gate voltage $V_G$ of zero.

$$I_{SD}=C_i\mu(W/2L)(V_G-V_T)^2 \qquad (1)$$

The average property value obtained from five or more transistors having a size of W (width)=1200 μm and L (length)=50 μm was hole mobility=1.8×10$^{-2}$ cm$^2$/Vs and current on/off ratio=10$^5$ ($V_{ds}$=−80V). This high on/off ratio suggests that the polymer material is less likely to undergo oxidation and thus is highly stable in the atmosphere and exhibits good process properties.

Figure 2:
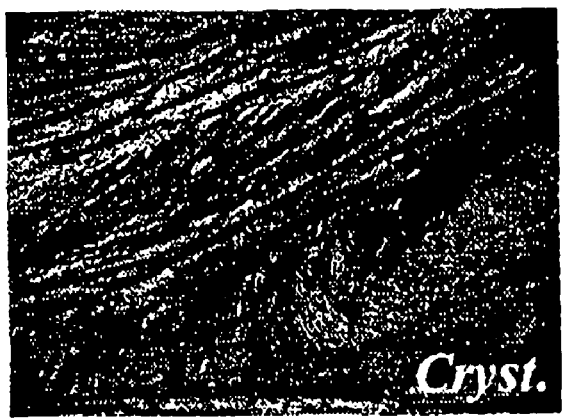
FIG. 2 is a diagram showing the results of observation of texture by a polarizing microscope and a heating stage using a glass cell into which 8T-ZZ-T8 has been poured.
Figure 2:
Figure 2:
Figure 2:
Figure 3:
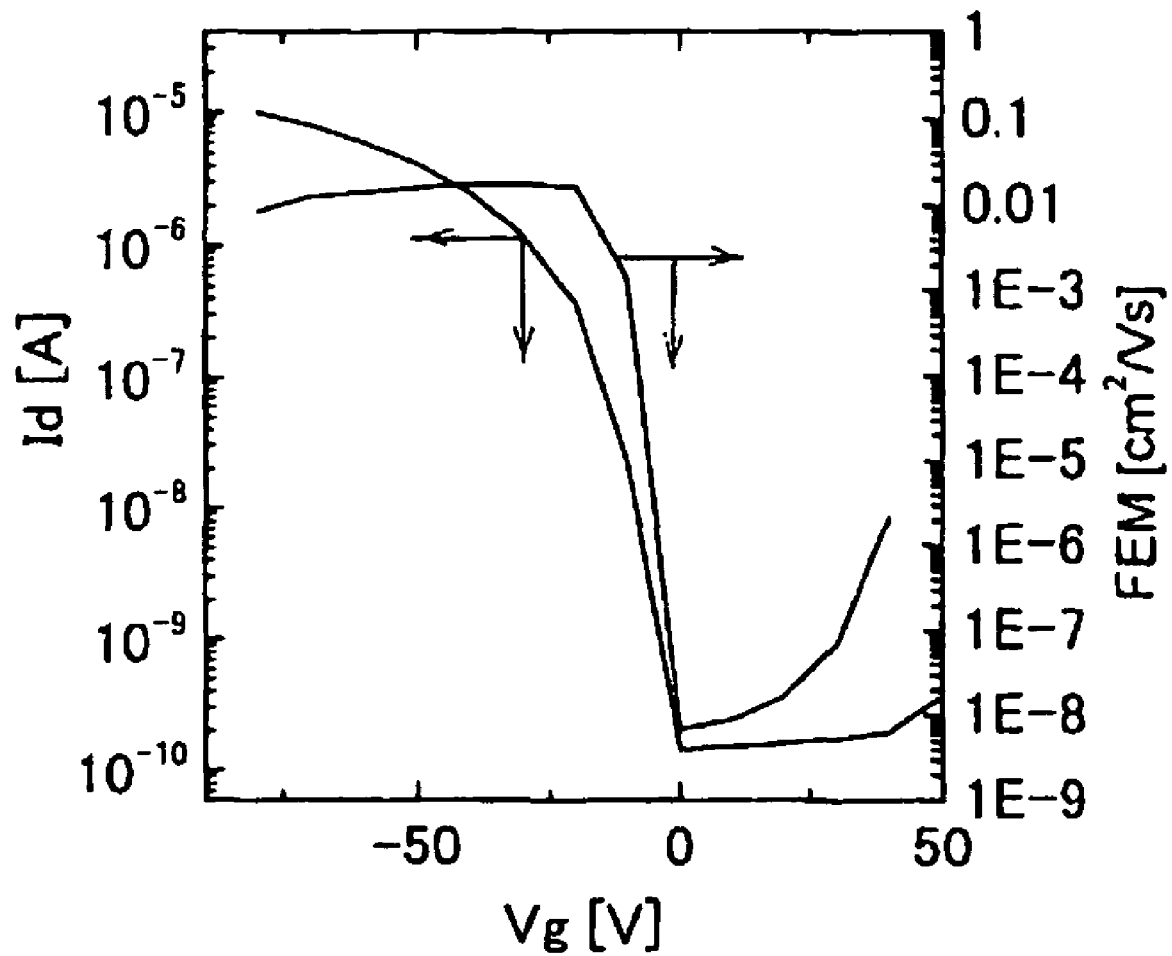
FIG. 3 is a graph showing the results of measurement of the hole mobility of 8T-ZZ-T8.

FIG. 2 shows the results of observation of texture by a polarizing microscope (BH2-UMA, manufactured by Olympus Corporation) and a heating stage (FP82HT and FP80HT, manufactured by METTLER-TOLEDO K.K.) using a glass cell into which 8T-ZZ-T8 has been poured. In the preparation of the FET element, the phase transition temperature between the crystal phase and the SmX1 phase in 8T-ZZ-T8 per se is 69.6° C. Since, however, the solution of 8T-ZZ-T8 in toluene has a lowered phase transition temperature due to the mixing effect, a coating film of 8T-ZZ-T8 in a liquid crystalline solution (mixed liquid crystal state) could be formed even by heating at about 60° C. FIG. 3 is a graph showing the results of measurement of the hole mobility.

Example 2

In Example 2, an organic semiconductor material, which is represented by chemical formula 2 wherein R3 and R4 represent a C10 identical straight chain alkyl group, was prepared.

Synthesis of 2-decylthiophene

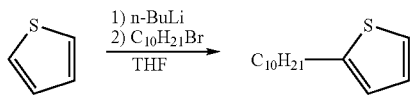

Thiophene (67.4 g, 0.801 mol) and THF (200 ml) were placed in a 1000-ml three-necked flask equipped with a 200-ml dropping funnel and a reflux tube. The solution was cooled to −78° C., and a solution (200 ml) of n-butyllithium (2.6 M) in n-hexane was added dropwise to the cooled solution over a period of about one hr. After the completion of the dropwise addition, the mixture was stirred at −78° C. for about one hr. Thereafter, the reaction temperature was raised to room temperature. At that temperature, the mixture was again stirred for one hr, and 1-bromodecane (118.0 g, 0.534 mol) was added dropwise thereto at 0° C. over a period of about one hr. After the completion of the dropwise addition, the reaction temperature was raised to room temperature, and, at that temperature, the mixture was stirred overnight. After the completion of the reaction, water (200 ml) was added, and the organic layer was extracted with diethyl ether, was dried over sodium sulfate, and was applied to column chromatography (n-hexane) to give an objective compound 2-decylthiophene as a yellow liquid (112.8 g, yield 96.60%). An NMR spectrum of the compound thus obtained was measured at room temperature with an NMR spectrometer (model JNM-LA400W, manufactured by Japan Electric Optical Laboratory). $^1$H-NMR (CDCl$_3$, TMS/ppm): 0.88 (t, 3H, J=6.83 Hz), 1.29 (m, 14H), 1.67 (m, 2H), 2.81 (t, 2H, J=7.32 Hz), 6.76 (d, 1H, J=3.91 Hz). 6.90 (dd, 1H, J=3.91 Hz, J=4.88 Hz), 7.09 (d, 1H, J=4.88 Hz.

Synthesis of 2-bromo-5-decylthiophene

2-Decylthiophene (52.8 g, 0.235 mol) prepared above and DMF (200 ml) were placed in a 1000-ml three-necked flask equipped with a 200-ml dropping funnel and a reflux tube. A solution of N-bromosuccinimide (hereinafter referred to as "NBS") (44.0 g, 0.247 mol) in DMF (100 ml) was added dropwise to the solution at room temperature in an argon gas stream over a period of about one hr. After the completion of the dropwise addition, the mixture was stirred with heating at 100° C. for about 2 hr. After the completion of the reaction, water (300 ml) was added to the reaction solution, and the organic layer was extracted with diethyl ether, was dried over sodium sulfate, and was applied to column chromatography (n-hexane) to give an objective compound 2-bromo-5-decylthiophene as a yellow liquid (67.0 g, yield 94.0%). An NMR spectrum of the compound thus obtained was measured at room temperature with an NMR spectrometer (model JNM-LA400W, manufactured by Japan Electric Optical Laboratory). $^1$H-NMR (CDCl$_3$, TMS/ppm): 0.88 (t, 3H, J=6.83 Hz), 1.26 (m, 14H), 1.61 (m, 2H), 2.73 (t, 2H, J=7.32 Hz), 6.52 (d, 1H, J=3.90 Hz). 6.83 (d, 1H, J=3.90 Hz).

Synthesis of 5-decyl-2,2'-bithiophene

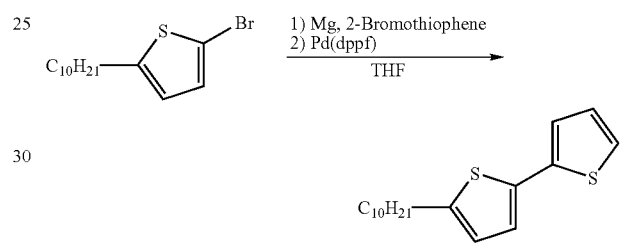

Magnesium (8.90 g, 0.365 mmol) and THF (100 ml) were placed in a 300-ml flask equipped with a reflux tube. A solution of 2-bromothiophene (54.0 g, 0.332 mmol) in THF (100 ml) was slowly added drowpwise thereto, and the mixture was heated under reflux for about 2 hr to prepare a Grignard reagent. This Grignard reagent was added dropwise to a mixed solution composed of [1,1'-bis(diphenylphosphino)ferrocene]palladium(II) dichloride dichloromethane complex (1:1) (1.80 g, 2.21 mmol), 2-bromo-5-decylthiophene (67.0 g, 221 mmol) prepared above, and THF (100 ml) at about 0° C. After the completion of the dropwise addition, the mixture was stirred at room temperature overnight. After the completion of the reaction, 1 N HCl (200 ml) was added to the reaction solution, and the organic layer was extracted with chloroform, was dried over sodium sulfate, and was applied to column chromatography (n-hexane) to give an objective compound 5-decyl-2,2'-bithiophene as a light yellow solid (67.1 g, yield 99.1%). An NMR spectrum of the compound thus obtained was measured at room temperature with an NMR spectrometer (model JNM-LA400W, manufactured by Japan Electric Optical Laboratory). $^1$H-NMR (CDCl$_3$, TMS/ppm): 0.88 (t, 3H, J=6.83 Hz), 1.31 (m, 14H), 1.67 (m, 2H), 2.78 (t, 2H, J=7.32 Hz), 6.67 (d, 1H, J=3.90 Hz), 6.98 (m, 2H), 7.09 (d, 1H, J=3.90 Hz), 7.15 (d, 1H, J=4.88 Hz)

Synthesis of 5-decyl-5'-formyl-2,2'-bithiophene

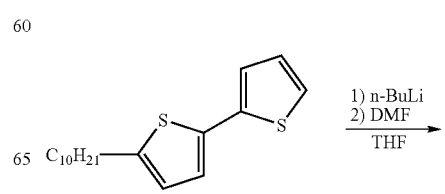

-continued

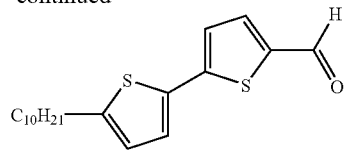

5-Decyl-2,2'-bithiophene (39.0 g, 0.127 mol) prepared above and THF (300 ml) were placed in a 1000-ml three-necked flask equipped with a 200-ml dropping funnel and a reflux tube. The solution was cooled in an ice bath to 0° C., and a solution (80 ml) of n-butyllithium (1.6 M) in n-hexane was added dropwise to the cooled solution over a period of about one hr. After the completion of the dropwise addition, the mixture was stirred for about one hr. DMF (13.9 g, 0.191 mol) was added dropwise thereto at 0° C. over a period of about one hr. After the completion of the dropwise addition, the reaction temperature was raised to room temperature, and, at that temperature, the mixture was stirred overnight. After the completion of the reaction, a 1 N ammonium chloride solution (200 ml) was added, and the organic layer was extracted with diethyl ether, was dried over sodium sulfate, and was applied to column chromatography ($CH_2Cl_2$:hexane=1:1) to give an objective compound 5-decyl-5'-formyl-2,2'-bithiophene as a yellow solid (37.2 g, yield 87.60%). An NMR spectrum of the compound thus obtained was measured at room temperature with an NMR spectrometer (model JNM-LA400W, manufactured by Japan Electric Optical Laboratory). $^1$H-NMR ($CDCl_3$, TMS/ppm): 0.88 (t, 3H, J=6.83 Hz), 1.26 (m, 14H), 1.69 (m, 2H), 2.81 (t, 2H, J=7.32 Hz), 6.74 (d, 1H, J=3.90 Hz), 7.16 (d, 1H, J=3.90 Hz), 7.18 (d, 1H, J=3.90 Hz), 7.64 (d, 1H, J=3.90 Hz), 9.84 (s, 1H).

Synthesis of 2,5-bis(5'-decyl-5-[2,2']bithienyl)-1,3-thiazolo[5,4-d]-1,3-thiazole (10TT-ZZ-TT10)

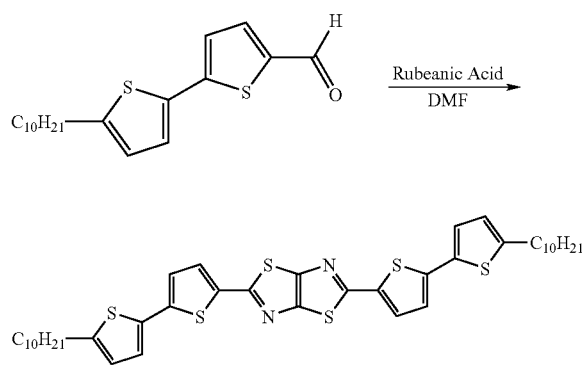

5-Decyl-5'-formyl-2,2'-bithiophene (37.2 g, 0.111 mmol) prepared above, rubeanic acid (3.34 g, 27.8 mmol), and DMF (200 ml) were placed in a 300-ml eggplant-type flask equipped with a reflux tube, and the solution was heated under reflux in an oil bath in an argon gas stream for about 6 hr. After the completion of the reaction, the mixture was allowed to cool to room temperature. Water (200 ml) was added thereto, and the precipitated brown crystal was collected by filtration and was dried in vacuo. After drying, the brown powder thus obtained was applied to column chromatography (toluene), followed by recrystallization twice from N-methyl-2-pyrrolidinone to give an objective compound 2,5-bis(5'-decyl-5-[2,2']bithienyl)-1,3-thiazolo-[5,4-d]-1,3-thiazole (10TT-ZZ-TT10) as an orange powder (10.4 g, yield 50.2%). An NMR spectrum of the compound thus obtained was measured at room temperature with an NMR spectrometer (model JNM-LA400W, manufactured by Japan Electric Optical Laboratory). $^1$H-NMR ($CDCl_3$, TMS/ppm): 0.88 (t, 6H, J=6.83 Hz), 1.38 (m, 28H), 1.69 (m, 4H), 2.81 (t, 4H, J=7.32 Hz), 6.71 (d, 2H, J=3.90 Hz), 7.07 (t, 4H, J=3.90 Hz), 7.44 (d, 2H, J=3.90 Hz).

Preparation of FET Element

A wafer purchased, from ELECTRONICS AND MATERIALS CORPORATION LIMITED, which is an n-doped silicon wafer as used in Example 1, was used in a test device. This wafer was immersed in a 0.1 M dehydrated toluene solution of phenyltrichlorosilane at 60° C. for 20 min. Next, this wafer was washed with toluene, and the remaining liquid was removed by a nitrogen air gun, followed by drying at 100° C. for one hr. Next, gold source and drain electrodes were vacuum deposited onto the silicon oxide dielectric layer through a shadow mask with varied channel length and width. Thus, a series of transistor electrodes having various sizes were prepared. Thereafter, this wafer was heated to 100° C., and an organic semiconductor layer was formed by spin coating at solution temperature of 100° C. at a speed of 2000 rpm for about 10 sec. The solution for the formation of the organic semiconductor layer was prepared by dissolving 0.5% by weight of 2,5-bis(5'-decyl-5-[2,2']bithienyl-1,3-thiazolo[5,4-d]-1,3-thiazole (10TT-ZZ-TT10) prepared above in tetralin. These procedures were carried out under ambient conditions, and any measure for preventing the exposure of the material and apparatus to ambient oxygen, moisture, or light was not taken.

FET properties were evaluated by 237 HIGH VOLTAGE SOURCE MEASURE UNIT, manufactured by KEITHLEY as used in Example 1. The carrier mobility (μ) was calculated based on data in a saturation region (gate voltage $V_G$<source-drain voltage $V_{SD}$) by the above equation (1).

The average property value obtained from five or more transistors having a size of W (width)=1200 μm and L (length)=25 μm was hole mobility=$1.7 \times 10^{-3}$ $cm^2$/Vs and current on/off ratio=$10^4$ ($V_{ds}$=−80V). This high on/off ratio suggests that the polymer material is less likely to undergo oxidation and thus is highly stable in the atmosphere and exhibits good process properties.

Figure 5:
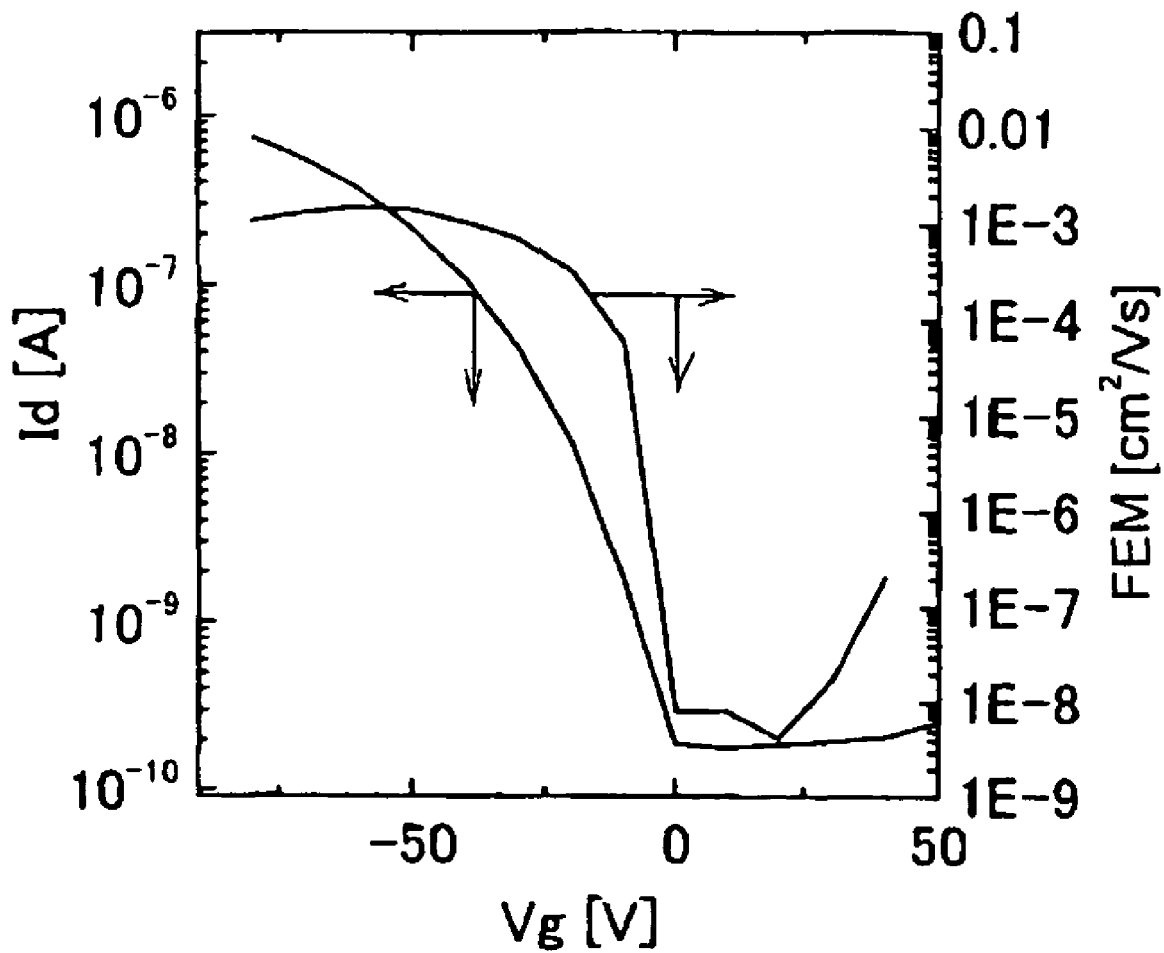
FIG. 5 is a graph showing the results of measurement of the hole mobility of 10TT-ZZ-TT10.

FIG. 4 shows the results of observation of texture by a polarizing microscope (BH2-UMA, manufactured by Olympus Corporation) and a heating stage (FP82HT and FP80HT, manufactured by METTLER-TOLEDO K.K.) using a glass cell into which 10TT-ZZ-TT10 has been poured. In the preparation of the FET element, the phase transition temperature between the crystal phase and the SmX phase in 10TT-ZZ-TT10 per se is 155.7° C. Since, however, the solution of 10TT-ZZ-TT10 in tetralin has a lowered phase transition temperature due to the mixing effect, a coating film of 10TT-ZZ-TT10 in a liquid crystalline solution (mixed liquid crystal state) could be formed even by heating at about 100° C. FIG. 5 is a graph showing the results of measurement of the hole mobility.

The invention claimed is:

1. An organic semiconductor material represented by chemical formula 1 wherein R1 and R2 represent an identical alkyl group having 8 to 20 carbon atoms:

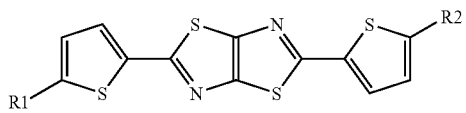

1 wherein the organic semiconductor material has a bilaterally symmetric chemical structure; and
wherein the organic semiconductor material is liquid crystalline and has solubility in solvents.

2. An organic semiconductor material represented by chemical formula 2 wherein R3 and R4 represent an identical alkyl group having 10 to 20 carbon atoms:

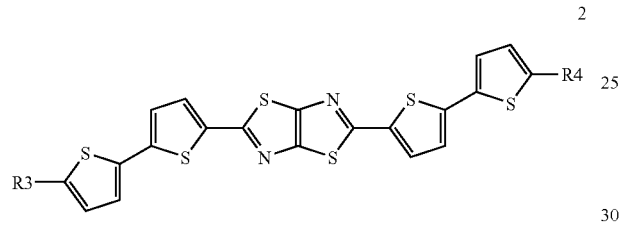

2 wherein the organic semiconductor material has a bilaterally symmetric chemical structure; and
wherein the organic semiconductor material is liquid crystalline and has solubility in solvents.

3. An organic semiconductor structure comprising an organic semiconductor layer comprising an organic semiconductor material according to claim 1, said organic semiconductor layer comprising a smectic liquid crystal phase or a crystal phase at least in a room temperature region.

4. An organic semiconductor device comprising at least a substrate, a gate electrode, a gate insulating layer, an organic semiconductor layer, a drain electrode, and a source electrode, said organic semiconductor layer comprising an organic semiconductor material according to claim 1.

5. An organic semiconductor structure according to claim 3, in the form of an organic transistor, an organic EL element, an organic electronic device, or an organic solar cell.

6. An organic semiconductor device comprising at least a substrate, a gate electrode, a gate insulating layer, an organic semiconductor layer, a drain electrode, and a source electrode, said organic semiconductor layer comprising an organic semiconductor material represented by chemical formula 1 or 2:

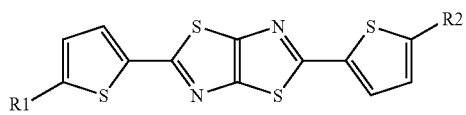

1 wherein R1 and R2 represent an identical alkyl group having 8 to 20 carbon atoms;

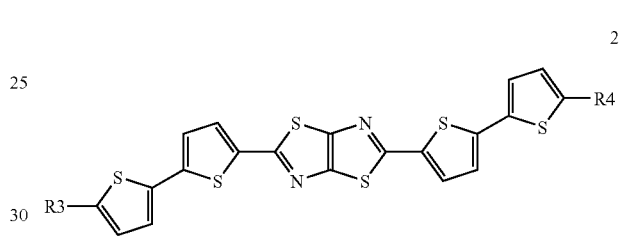

2 wherein R3 and R4 represent an identical alkyl group having 740 to 20 carbon atoms;
wherein the organic semiconductor material has a bilaterally symmetric chemical structure, and wherein the organic semiconductor material is liquid crystalline and has solubility in solvents.

7. An organic semiconductor material according to claim 1 wherein R1 and R2 are octyl.

8. An organic semiconductor material according to claim 2 wherein R3 and R4 are decyl.

* * * * *

UNITED STATES PATENT AND TRADEMARK OFFICE
CERTIFICATE OF CORRECTION

PATENT NO. : 7,935,828 B2  Page 1 of 1
APPLICATION NO. : 11/445940
DATED : May 3, 2011
INVENTOR(S) : Ken Tomino et al.

It is certified that error appears in the above-identified patent and that said Letters Patent is hereby corrected as shown below:

Column 18

*Line 34*: please change "740" to --10--

Signed and Sealed this
Twenty-first Day of June, 2011

David J. Kappos
*Director of the United States Patent and Trademark Office*